(12) United States Patent
Umemiya et al.

(10) Patent No.: US 7,521,745 B2
(45) Date of Patent: Apr. 21, 2009

(54) SEMICONDUCTOR DEVICE REDUCING LEAKAGE ACROSS A FERROELECTRIC LAYER

(75) Inventors: Shigeyoshi Umemiya, Kawasaki (JP); Osamu Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 97 days.

(21) Appl. No.: 11/580,198

(22) Filed: Oct. 13, 2006

(65) Prior Publication Data
US 2007/0029595 A1 Feb. 8, 2007

Related U.S. Application Data

(63) Continuation of application No. PCT/JP2004/006203, filed on Apr. 28, 2004.

(51) Int. Cl.
*H01L 29/92* (2006.01)

(52) U.S. Cl. ............ 257/295; 257/310; 257/535; 257/E29.343

(58) Field of Classification Search ............ 257/310, 257/528, 532, 535, E29.343, 295
See application file for complete search history.

(56) References Cited

U.S. PATENT DOCUMENTS

| | | | |
|---|---|---|---|
| 5,753,934 A | | 5/1998 | Yano et al. |
| 5,801,105 A | | 9/1998 | Yano et al. |
| 6,523,943 B1 * | | 2/2003 | Fukui .................. 347/68 |
| 6,884,649 B2 * | | 4/2005 | Kobayashi et al. ........ 438/50 |
| 2003/0080329 A1 * | | 5/2003 | Kurasawa et al. ........ 257/3 |

FOREIGN PATENT DOCUMENTS

| | | | |
|---|---|---|---|
| EP | 1115148 A1 | | 7/2001 |
| JP | 4-206870 A | | 7/1992 |
| JP | 9-110592 A | | 4/1997 |
| JP | 10-173139 A | | 6/1998 |
| JP | 10-189885 A | | 7/1998 |
| JP | 2000-109362 A | | 4/2000 |
| JP | 2001-28426 A | | 1/2001 |
| JP | 2001-77110 A | | 3/2001 |
| JP | 2003-204088 A | | 7/2003 |

(Continued)

OTHER PUBLICATIONS

Mark Brazier et al., "Unconventional hysteresis behavior in compositionally graded Pb(Zr,Ti)O₃ thin films", Applied Physics Letters, Mar. 2, 1998, vol. 72, No. 9, pp. 1121 to 1123.

(Continued)

*Primary Examiner*—Marcos D. Pizarro
(74) *Attorney, Agent, or Firm*—Westerman, Hattori, Daniels & Adrian, LLP.

(57) ABSTRACT

A bottom electrode (52) made of Ir, an initial layer (53), a core layer (54) and a termination layer (55) of a PZT film, and a top electrode (56) made of $IrO_2$, are formed on an underlining film (51). The initial layer (53) is formed in a low oxygen partial pressure with a thickness of 5 nm. The thickness of the core layer (54) is set to 120 nm. The termination layer (55) is set to be an excess Zr layer. In other words, as for the composition of the termination layer (55), "Zr/(Zr+Ti)" is set to be larger than 0.5, and in the termination layer (55) Zr is contained more excessively than the morphotropic phase boundary composition.

6 Claims, 14 Drawing Sheets

FOREIGN PATENT DOCUMENTS

WO        WO 99/42282 A1     8/1999

OTHER PUBLICATIONS

Patent Abstract of Japan, Publication No. 11-220106, dated Aug. 10, 1999.
Patent Abstract of Japan, Publication No. 2003-126877, dated May 7, 2003.
Patent Abstract of Japan, Publication No. 11-126877, dated May 11, 1999.
Patent Abstract of Japan, Publication No. 05-234419, dated Sep. 10, 1993.
Patent Abstract of Japan, Publication No. 06-049638, dated Feb. 22, 1994.
Patent Abstract of Japan, Publication No. 62-012696, dated Jan. 21, 1987.
Patent Abstract of Japan, Publication No. 2001-196652, dated Jul. 19, 2001.
Patent Abstract of Japan, Publication No. 05-110159, dated Apr. 30, 1993.
Patent Abstract of Japan, Publication No. 2003-142657, dated May 16, 2003.
Patent Abstract of Japan, Publication No. 10-050960, dated Feb. 20, 1998.
International Search Report of PCT/JP2004/006203, date of mailing Aug. 3, 2004.
Notification of Transmittal of Translation of the International Preliminary Report on Patentability of International Application No. PCT/JP2004/006203, with Form PCT/ISA/237, dated Nov. 9, 2006.

* cited by examiner

SEMICONDUCTOR DEVICE REDUCING LEAKAGE ACROSS A FERROELECTRIC LAYER

TECHNICAL FIELD

The present invention relates to a semiconductor device suitable for a non-volatile memory with a ferroelectric capacitor, and manufacturing method therefor.

BACKGROUND ART

As to manufacturing a capacitor to be provided to a DRAM and a ferroelectric memory, various kinds of material and film forming methods have been suggested. In addition, the film forming methods practically utilized now are mainly a sol-gel method and a sputtering method. However, for recent scale up of the integration degree of a memory, it becomes difficult for the methods to achieve thinning of a film thickness and step coverage. Consequently, a film forming method by means of a MOCVD (Metal Organic Chemical Vapor Deposition) method has recently come to attract attention.

However, when a PZT ($Pb(Zr, Ti)O_3$) film is formed by the MOCVD method, its composition, especially, its ratio of the numbers between A-site atoms and B-site atoms (hereinafter, also referred to as A/B ratio) tends to fluctuate. When the A/B ratio fluctuates, the electric characteristics of a ferroelectric capacitor (switching charge amount Qsw and leak current) largely fluctuate. In general, it is considered to be preferable to suppress the fluctuation range of the electric characteristics to be within ±0.5%. Moreover, in a conventional ferroelectric capacitor with a PZT film, as its A/B ratio becomes higher, its switching charge amount Qsw becomes larger and its leak current becomes larger.

For this reason, in the conventional ferroelectric capacitor, though, in order to obtain a large switching charge amount Qsw, the A/B ratio is intended to be set high within an allowable range of the leak current, the A/B ratio may practically fluctuate beyond a predicted range, which may cause the leak current to exceed the allowable range. Accordingly, since it is required to set the A/B ratio while preliminarily estimating the fluctuation range of the leak current to be larger, it is currently difficult to obtain a large switching charge amount Qsw.

Patent Document 1

Japanese Patent No. 3385889

SUMMARY OF THE INVENTION

An object of the present invention is to provide a semiconductor device which can suppress fluctuation of a leak current while obtaining a large switching charge amount, and a manufacturing method therefor.

A semiconductor device according to the present invention is directed to a semiconductor device which includes a semiconductor substrate, a pair of electrodes formed above the semiconductor substrate, and a ferroelectric film composed of an $ABO_3$-type structure and sandwiched between the pair of electrodes. The semiconductor device is characterized in that the ferroelectric film has, in a part thereof, a non-MPB (morphotropic phase boundary) layer containing an atom which most hardly changes its valence number among plural kinds of atoms arranged at the B site, more excessively than the MPB (morphotropic phase boundary) compositions with respect to the plural kinds of atoms.

Moreover, in a manufacturing method of the semiconductor device according to the present invention, a ferroelectric capacitor is formed which has a pair of electrodes and a ferroelectric film composed of an $ABO_3$-type structure and sandwiched between the pair of electrodes, above a semiconductor substrate. When the ferroelectric film is formed, in a part thereof, a non-MPB layer is formed. The non-morphotropic phase boundary layer contains an atom which most hardly changes its valence number among plural kinds of atoms arranged at the B-site more excessively than the MPB compositions with respect to the plural kinds of atoms.

According to the present invention, since, even when an A/B ratio is set to be higher than that of a prior art, the fluctuation of leak current accompanied with the fluctuation of the A/B ratio is suppressed. Therefore it is possible to suppress the leak current from becoming higher than expected.

DETAILED DESCRIPTION OF THE PREFERRED EMBODIMENTS

Basic Principle of the Present Invention

First, the basic principle of the present invention will be described.

Figure 1:
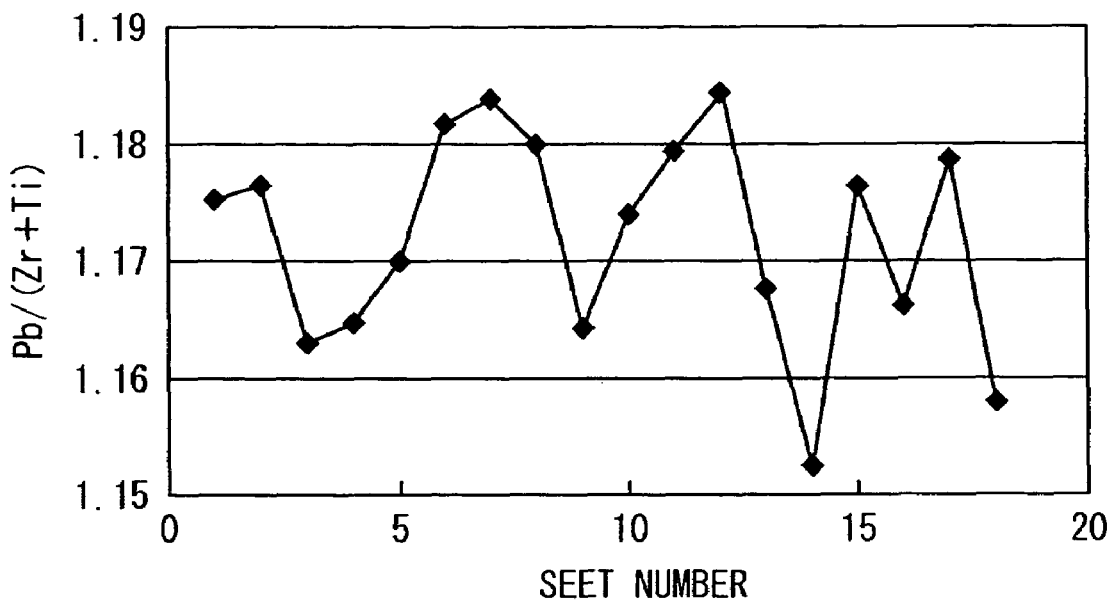
FIG. 1 is a graph showing fluctuation of A/B ratio of PZT films.
Figure 2:
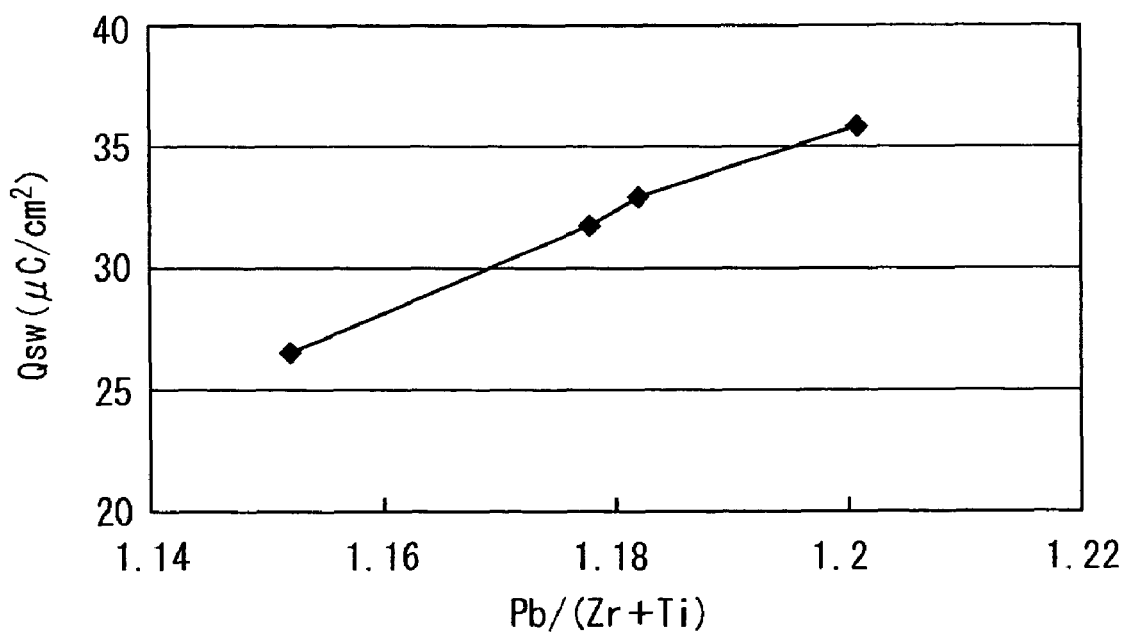
FIG. 2 is a graph showing a relationship between an A/B ratio and a switching charge amount Qsw.
Figure 3:
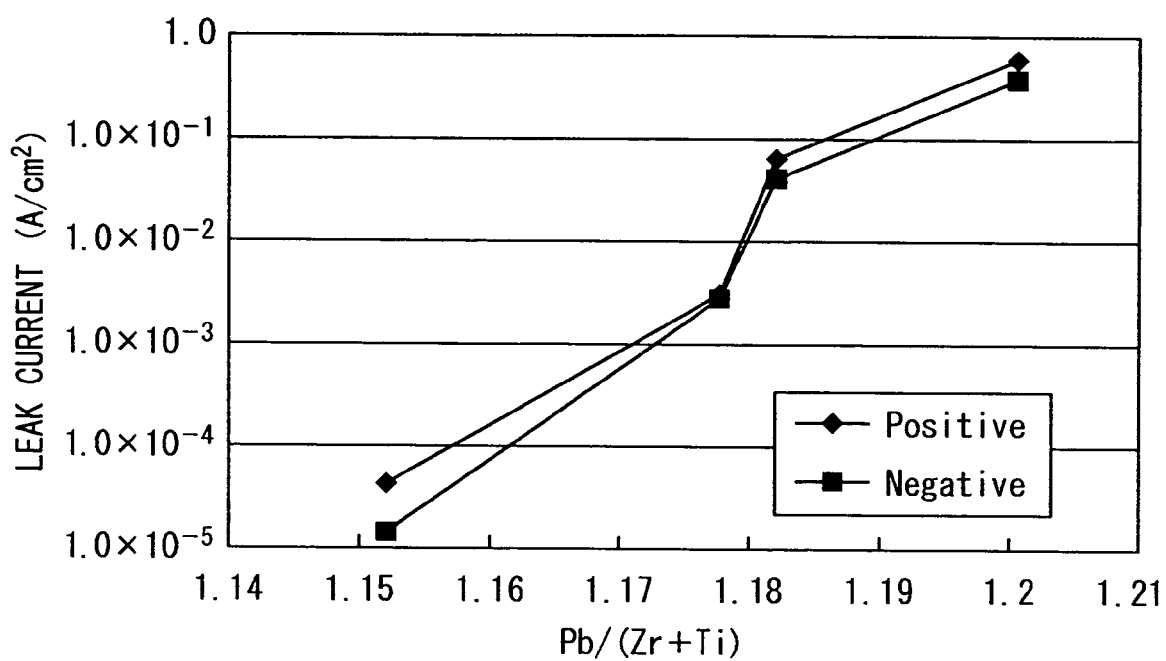
FIG. 3 is a graph showing a relationship between an A/B ratio and a leak current.

The inventor of the present invention performed experiments with respect to the fluctuation of an A/B ratio of a PZT film in a ferroelectric capacitor formed by a conventional method, and the fluctuations of switching charge amount Qsw and leak current accompanied with the fluctuation of the A/B ratio. FIG. 1 is a graph showing the fluctuation of the A/B ratio of PZT films formed using the same apparatus under the same condition. FIG. 2 is a graph showing the relationship between the A/B ratio and the switching charge amount Qsw (applied voltage: 1.8 V). FIG. 3 is a graph showing the relationship between the A/B ratio and the leak current (applied voltage: 3.0 V).

As shown in FIG. 1, even when the PZT films were formed using the same apparatus under the same condition, the fluctuation of the A/B ratio was large. Moreover, as shown in FIGS. 2 and 3, the fluctuations of the switching charge amount Qsw and the leak current accompanied with the fluctuation of the A/B ratio were also large. For example, in the example shown in FIG. 1, the minimum value of the A/B ratios was about 1.152, and the maximum value of the A/B ratios was about 1.184. In addition, the minimum value of the switching charge amounts Qsw at these A/B ratios was about 27 ($\mu C/cm^2$), and the maximum value was about 33 ($\mu C/cm^2$). Accordingly, when based on, the fluctuation range of the switching charge amount Qsw was about ±10% with 30 ($\mu C/cm^2$) as a standard. Moreover, as shown in FIG. 3, the fluctuation range of the leak current at these A/B ratios was three digits or more.

However, in a conventional MOCVD apparatus, such a fluctuation of compositions cannot be suppressed. On the contrary, if there is a structure whose electric characteristics hardly fluctuate even when its composition fluctuates, the fluctuation of its leak current can be suppressed, while a large switching charge amount Qsw is obtained, thereby, resulting in the resolution of the conventional problems.

Based on such a viewpoint, the energetic investigation by the inventor of the present invention revealed the following. By containing a layer (hereinafter, also referred to as an excess Zr layer) that includes larger amount of Zr than that of Ti, for example, in a PZT film, Zr being an atom whose valence number changes most hardly of Zr and Ti that are atoms arranged at the B-site, the dielectric constant of the PZT film hardly changes, and the layer acts as a barrier layer with respect to the leak current. Accordingly, by employing such a structure, even when the switching charge amount Qsw is set higher, it is possible to suppress the increase of the leak current.

However, if the excess Zr layer is located at the center of the PZT film, in some cases, sufficient switching charge amounts Qsw cannot be obtained. Moreover, if the excess Zr layer is located at the lower side in the PZT film, in some cases, the orientation of the PZT film decreases. On the contrary, if the excess Zr layer is located at the upper side in the PZT film, there is a low possibility that problems occur. Accordingly, it is preferable for the excess Zr layer to be located at the upper side in the PZT film.

Figure 4:
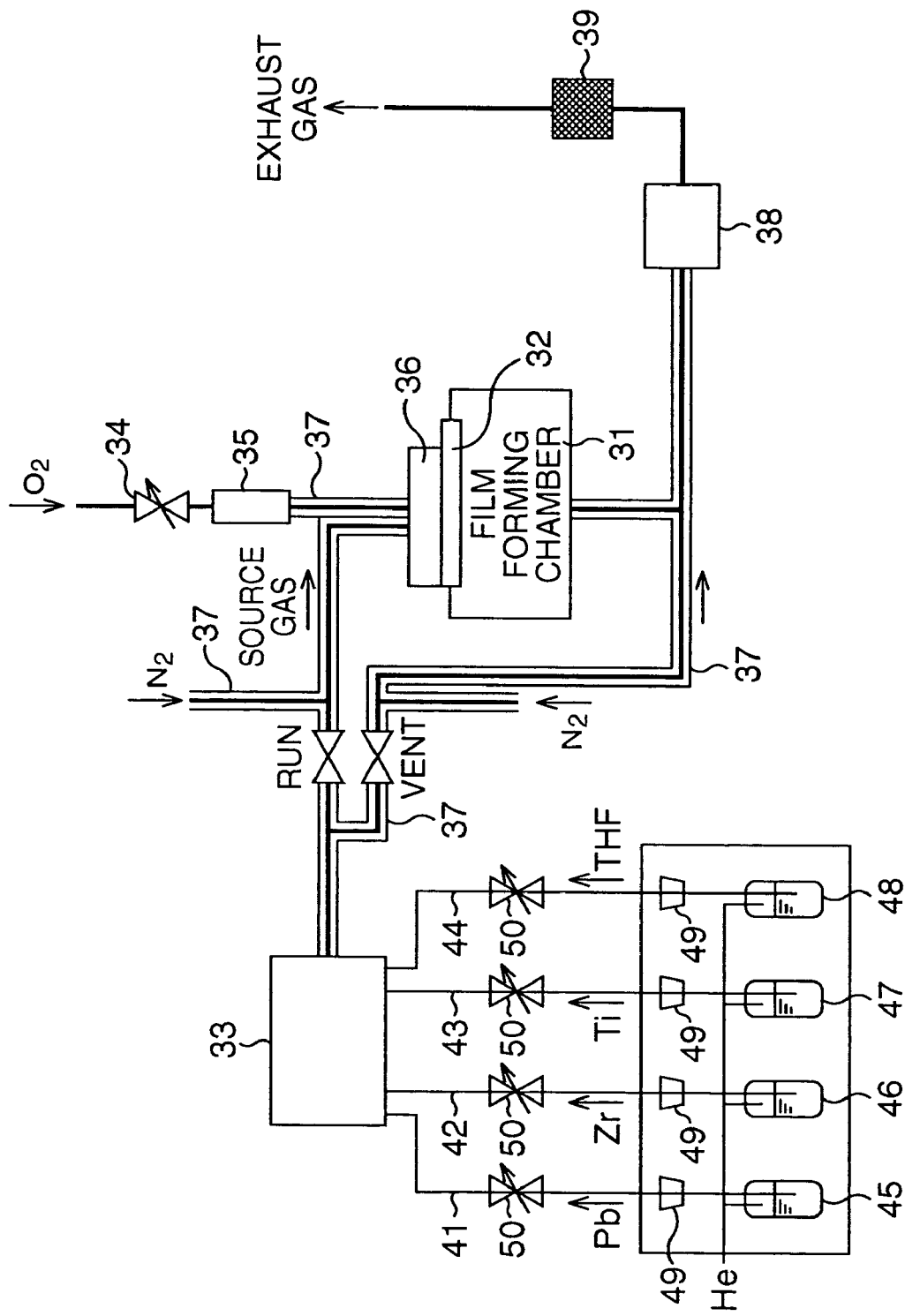
FIG. 4 is a schematic view showing an MOCVD film forming apparatus.

Next, an experiment performed by the inventor of the present invention to verify the effect of the presence of the excess Zr layer will be described. FIG. 4 is a schematic view showing an MOCVD film forming apparatus used in the experiment.

The MOCVD film forming apparatus is provided with a film forming chamber (chamber) 31, a shower head 32 arranged on the upper side in the film forming chamber 31, a vaporizer 33 supplying a source gas to the film forming chamber 31, a mass flow controlling valve 34 adjusting the flow (flow rate) of a reaction gas (O2) reacting with the source gas, a heat exchanger 35 heating the reaction gas, a gas mixer 36 mixing the source gas and the reaction gas, a vacuum pump 38, and a scrubber 39. The pipe to the vacuum pump 38 is arbitrarily heated by a pipe heating member 37.

A pipe 41 for supplying Pb, a pipe 42 for supplying Zr, a pipe 43 for supplying Ti, and a pipe 44 for supplying THF (tetrahydrofuran) are coupled to the vaporizer 33. Containers 45, 46, and 47 containing organic metal containing Pb, Zr, and Ti are respectively connected to the pipes 41, 42, and 43. A container 48 containing a liquid solution of THF is connected to the pipe 44. The flow control in these components is performed using a mass flow controller 49 for a liquid and a valve 50. Then, in the vaporizer 33, each liquid raw material supplied is vaporized together with a solvent to become a source gas and supplied to the gas mixer 36 through a temperature controlled pipe. In addition, at the exit of the vaporizer 33, a line for purging nitrogen is connected. It is therefore possible to maintain the flow of a gas entering the film forming chamber 31 to be constant when a film is formed and when a film is not formed.

Meanwhile, the reaction gas ($O_2$) is supplied to the gas mixer 36 at a constant flow via the mass flow controller 34. At this time, by the heat exchanger 35, the temperature of the reaction gas is heated to the vaporization temperature of a raw material.

Then, in the gas mixer 36, the source gas and the reaction gas are mixed, and the mixed gas flows into the shower head 32.

In the film forming chamber 31, when a film is formed on a wafer, the temperature of the wafer is kept, for example, at 500° C. to 650° C. When, in such a situation, the mixed gas is supplied from the shower head 32 toward a stage (not shown), in other words toward a wafer placed on the stage, an organic metal gas in the mixed gas is dissolved at the wafer surface by the thermal energy of the wafer, thereby forming a thin film (for example, PZT thin film). The film forming gas not used for the film formation is absorbed by the vacuum pump 38, decomposed by the scrubber 9 through an exhaust port, rendered to be harmless, and exhausted in an atmosphere.

Figure 5:
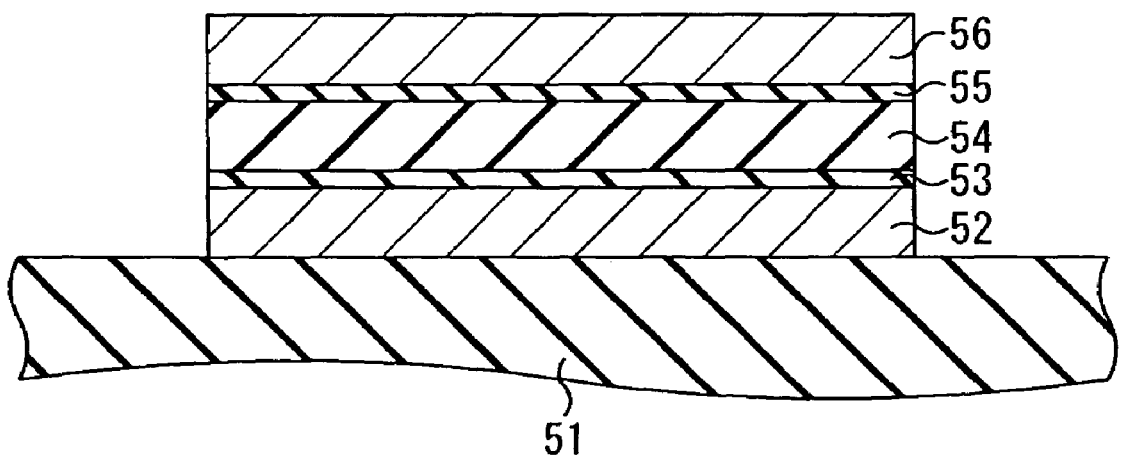
FIG. 5 is a sectional view showing a method of forming a sample.

In addition, in the experiment, as shown in FIG. 5, on an underlying film 51, a bottom electrode 52 made of Ir, an initial layer 53 of a ferroelectric film (PZT film), a core layer 54 and a termination layer 55, and a top electrode 56 made of $IrO_2$, were formed.

When the initial layer 53, the core layer 54, and the termination layer 55 of the PZT film were formed, the MOCVD apparatus shown in FIG. 4 was used. In addition, $Pb(DPM)_2$ (bis [di-pivaloylmethanate]-lead) was used as an organic metal containing Pb, $Zr(DMHD)_4$ (tetrakis [di-methylhexanedionate]-zirconium) was used as an organic metal containing Zr, and $Ti(O-iPr)_2(DPM)_2$ (bis [di-pivaloylmethanate-iso-propoxy]-titanium) was used as an organic metal containing Ti. Additionally, THF was used as a solvent. Moreover, a silicon wafer with a diameter of six inches was used as a wafer, and the wafer temperature was set to 620° C.

The initial layer 53 was formed with a thickness of 5 nm at a low oxygen partial pressure. The thickness of the core layer 54 was set to 120 nm. The termination layer 55 was formed as the excess Zr layer. These series of film formation were performed continuously, while controlling the flow of each raw material.

In this manner, in the experiment, the composition of the PZT film was controlled by independently controlling the flow of each raw material. It is possible to use a raw material whose composition has been adjusted from the beginning. However, in the experiment, since the PZT film has a structure with three layers, when such a raw material is used, three types of composition adjusted raw material are required. Moreover, when such a raw material is used, it is also not possible to adjust the composition fluctuation depending on the performance of the MOCVD apparatus. Therefore, in the experiment, as the raw materials of Pb, Zr and Pb, respectively independent materials were used.

In this way, six types of samples were produced, and their switching charge amounts Qsw and leak currents were measured. The following Table 1 shows the composition and the film thickness of the termination layer 55 in each sample. Here, in the table 1, "Pb/(Zr+Ti)" indicates the ratio of the total number of Pb atoms with respect to the total numbers of Zr atoms and Ti atoms, and "Zr/(Zr+Ti)" indicates the ratio of the total number of Zr atoms with respect to the total numbers of Zr atoms and Ti atoms. Accordingly, if "Pb/(Zr+Ti)" is larger than 1, it indicates that Pb is contained more excessively than the MPB (morphotropic phase boundary) composition, and if "Zr/(Zr+Ti)" is larger than 0.5, it indicates that Zr is contained more excessively than the MPB composition.

TABLE 1

| Sample | Pb/(Zr + Ti) | Zr/(Zr + Ti) | Film Thickness (nm) |
|---|---|---|---|
| No. 1 | — | — | — |
| No. 2 | 1.15 | 0.55 | 5 |
| No. 3 | 1.15 | 0.60 | 5 |
| No. 4 | 1.15 | 0.65 | 5 |
| No. 5 | 1.15 | 0.60 | 2 |
| No. 6 | 1.15 | 0.60 | 10 |

In sample No. 1, the termination layer 55 was not formed. In other words, sample No. 1 had a structure similar to that of a conventional PZT film. In samples No. 2, No. 3 and No. 4, "Zr/(Zr+Ti)" of the termination layer 55 was changed. Additionally, in samples No. 5 and No. 6, the thickness of the termination layer 55 was changed with respect to sample No. 3. In addition, as for compositions of the initial layer 53 and the core layer 54, "Pb/(Zr+Ti)" and "Zr/(Zr+Ti)" of the both compositions were set to 1.18 and 0.45, respectively.

Figure 6:
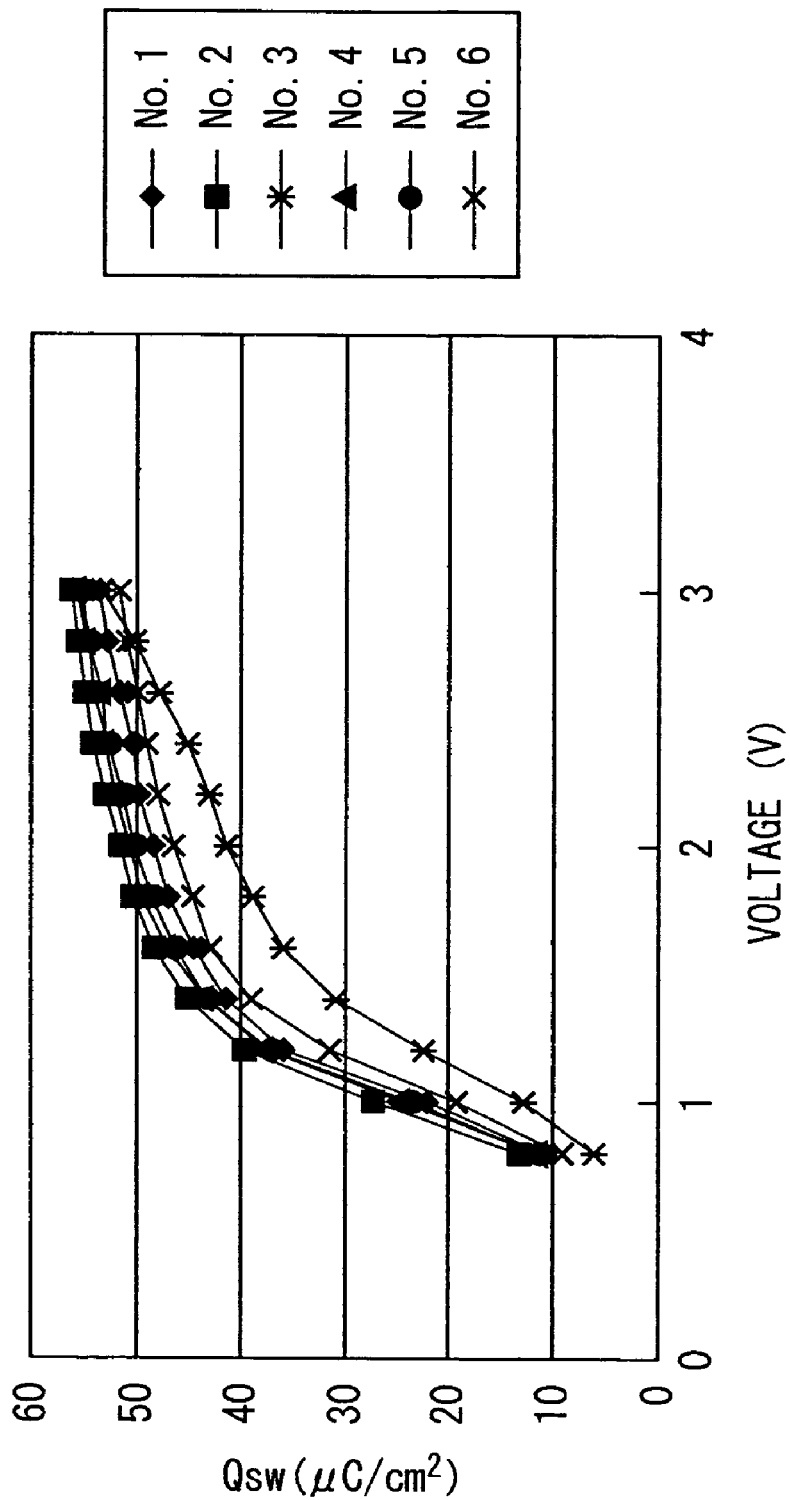
FIG. 6 is a graph showing a relationship between an applied voltage and a switching charge amount Qsw, when an excess Zr layer is used as a termination layer.
Figure 7:
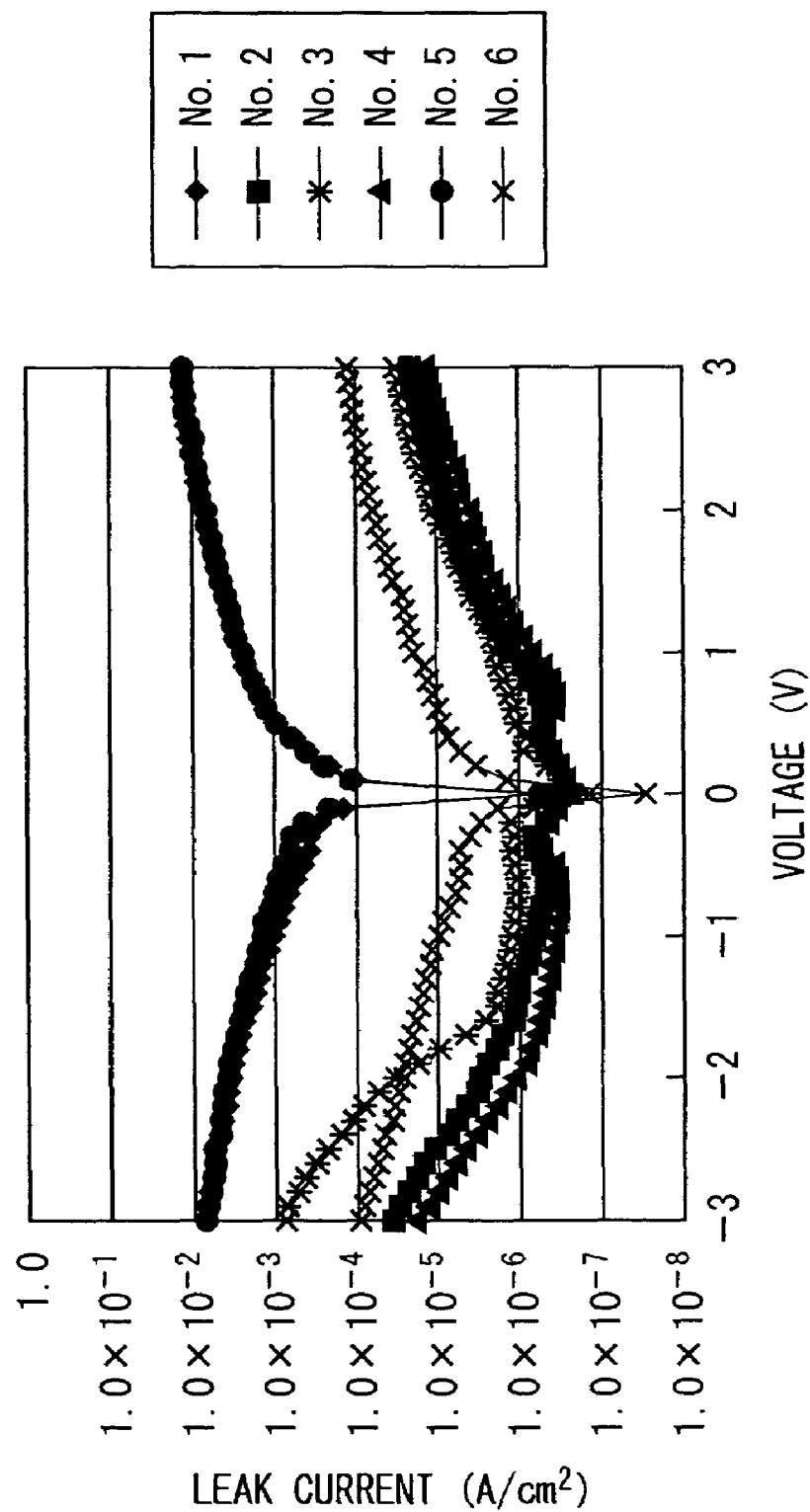
FIG. 7 is a graph showing a relationship between an applied voltage and a leak current, when an excess Zr layer is used as a termination layer.

The measured results of the switching charge amount Qsw and the leak current were shown in FIGS. 6 and 7, respectively.

In sample No. 1, as shown in FIG. 6, a good switching charge amount Qsw was obtained. However, since the termination layer 55 was not formed, as shown in FIG. 7, the leak current became very large.

On the contrary, in samples No. 2 to No. 6, as shown in FIGS. 6 and 7, it was possible to reduce their leak current, while ensuring their large switching charge amount Qsw, except for sample No. 5 whose termination layer was thin. In addition, as understood from the results of samples No. 2 to No. 4, if the values of "Zr/(Zr+Ti)" were 0.5 or more, even when the values differed from each other, similar results were obtained.

The inventor of the present invention also performed an experiment with respect to electric characteristics when an excess Zr layer was used as the initial layer 53. In the experiment, as for the initial layer 53, "Pb/(Zr+Ti)" was set to 1.15, "Zr/(Zr+Ti)" was set to 0.55, and its thickness was set to 5 nm. As for the core layer 54, "Pb/(Zr+Ti)" was set to 1.17, "Zr/(Zr+Ti)" was set to 0.45, and its thickness was set to 120 nm. However, the termination layer 55 was not formed. Then, similar to the above-mentioned experiment, the measurements of the switching charge amount Qsw and the leak current were performed. In addition, by an X-ray diffractometry (XRD), the orientation of the PZT film (the initial layer 53 and the core layer 54) was confirmed. These results were shown in FIGS. 8 to 10. It should be noted that, in FIG. 8, the solid line (excess Ti) indicates the orientation of a sample without the excess Zr initial layer 53 (sample corresponding to a conventional ferroelectric capacitor), and dotted line (excess Zr) indicates the orientation of a sample with the excess Zr initial layer 53.

Figure 8:
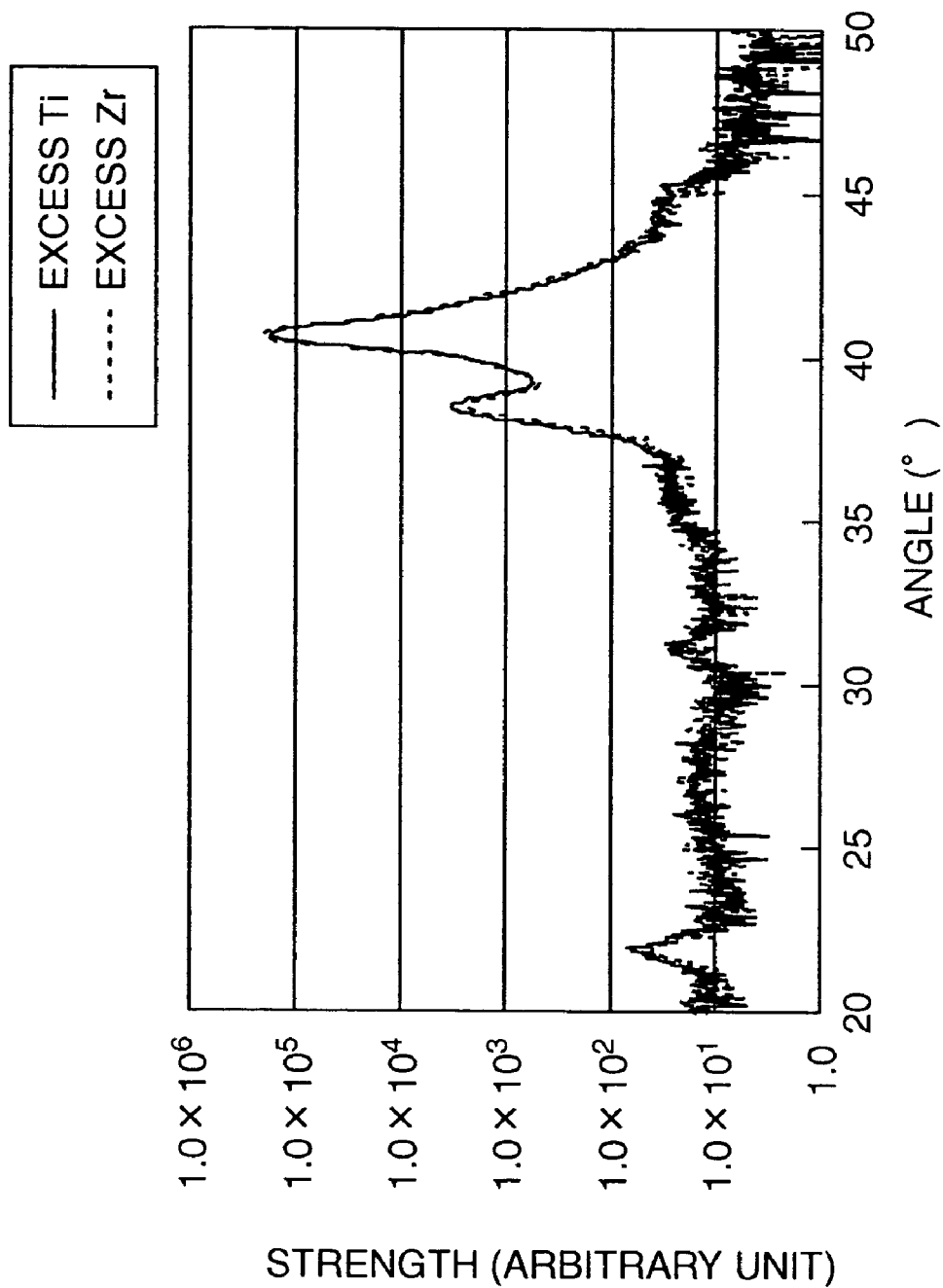
FIG. 8 is a graph showing the results of an X-ray diffractometry.

As shown in FIG. 8, even when the initial layer 53 was formed, the PZT film was oriented to (111) to the same extent when the initial layer 53 was not formed. In other words, even if an excess Zr layer was used as the initial layer 53, its degree of orientation did not decrease.

Figure 9:
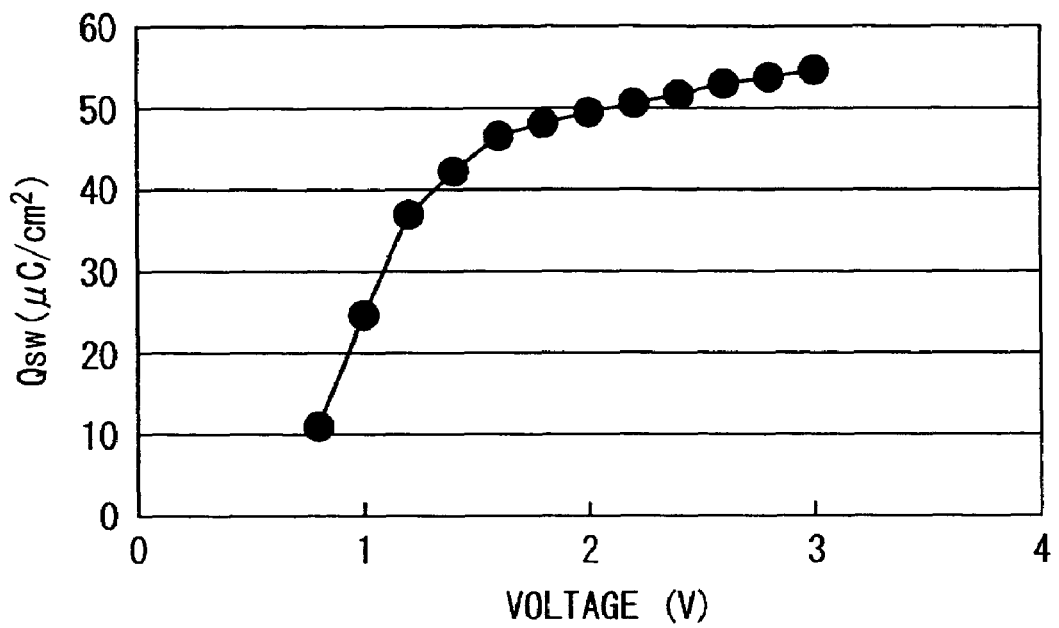
FIG. 9 is a graph showing the relationship between the applied voltage and the switching charge amount Qsw, when an excess Zr layer is used as an initial layer.
Figure 10:
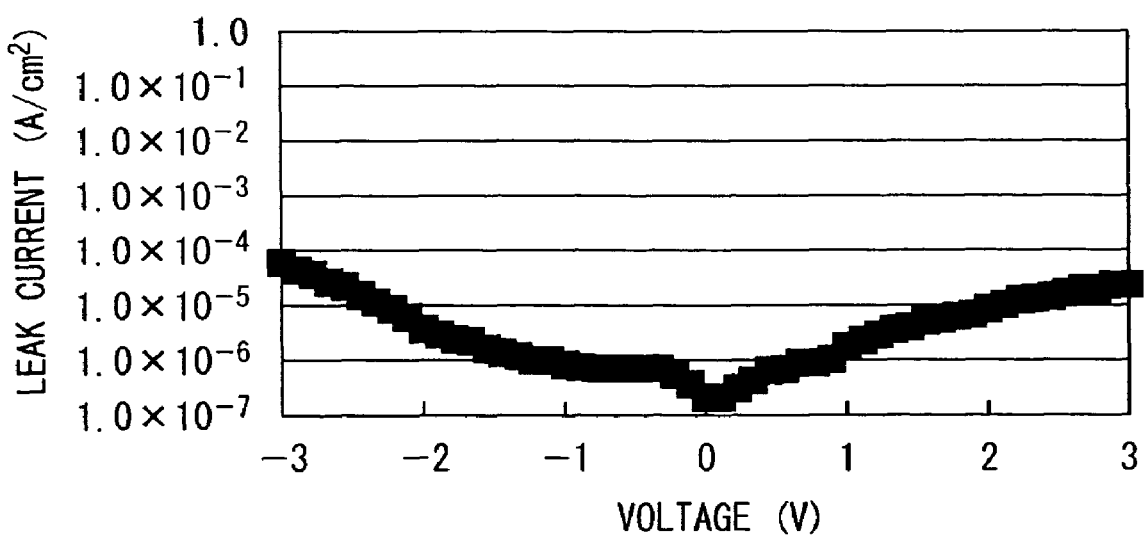
FIG. 10 is a graph showing a relationship between an applied voltage and a leak current, when an excess Zr layer is used as an initial layer.

Moreover, as shown in FIGS. 9 and 10, the results comparable to those obtained when an excess Zr layer was used as the termination layer 55 (FIGS. 6 and 7) were obtained.

Embodiment of the Present Invention

Figure 11:
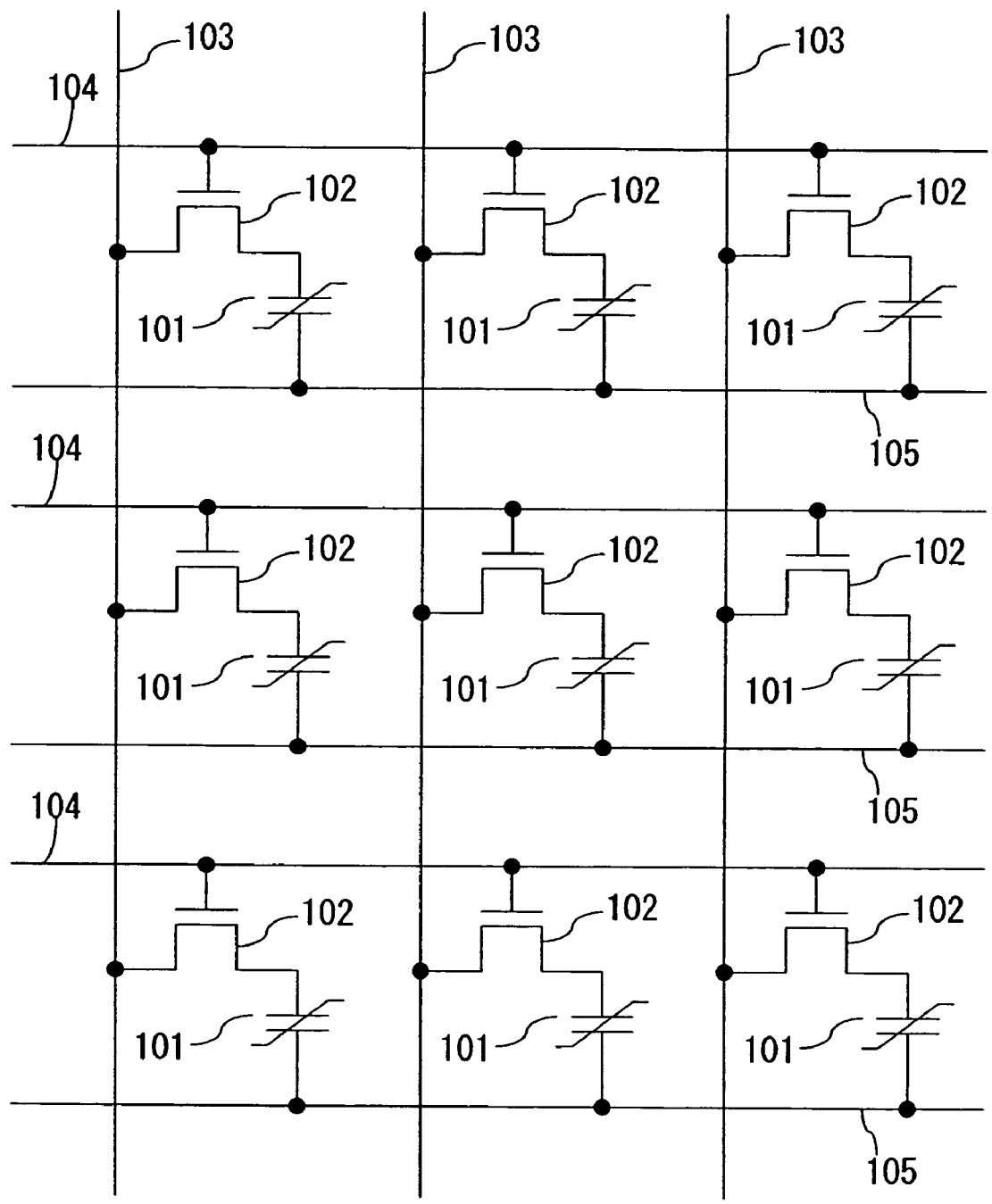
FIG. 11 is a circuit diagram showing the structure of a memory cell array of a ferroelectric memory (semiconductor device) to be manufactured by a manufacturing method according to an embodiment of the present invention.

Next, referring to the appended drawings, the embodiment of the present invention will be specifically described. FIG. 11 is a circuit diagram showing the structure of a memory cell array of a ferroelectric memory (semiconductor device) to be manufactured by a method according to the embodiment of the present invention.

In the memory cell array a plurality of bit lines 103 extending in one direction, and a plurality of word lines 104 and plate lines 105 extending in the direction perpendicular to the extending direction of the bit lines 103, are provided. Moreover, a plurality of memory cells of ferroelectric memories according to the present embodiment is arranged in array form so as to match the lattices composed of the bit lines 103, word lines 104, and plate lines 105.

The gates of MOS transistors 102 are connected to the word lines 4. Moreover, one source/drain of the MOS transistor 102 is connected to the bit line 103, and the other source/drain is connected to one electrode of the ferroelectric capacitor 101. In addition, the other electrode of the ferroelectric capacitor 101 is connected to the plate line 105. Here, each word line 104 and plate line 105 are shared by a plurality of MOS transistors 102 aligning in the same direction as the extending direction thereof. Similarly, each bit line 103 is shared by a plurality of MOS transistors 102 aligning in the same direction as the extending direction thereof. The direction in which the word lines 104 and the plate lines 105 extend, and the direction in which the bit lines 103 extend, may be referred to as row direction and column direction, respectively. However, the arrangement of bit lines 103, word lines 104, and plate lines 105 is not limited to the above-mentioned one.

In the memory cell array of ferroelectric memories thus structured, data is stored according to the polarized state of the ferroelectric film provided to the ferroelectric capacitor 101.

Next, the manufacturing method of a ferroelectric memory (semiconductor device) according to the embodiment of the present invention will be described. Here, in convenience, the sectional structure of each memory cell will be described together with its manufacturing method. FIGS. 12A to 12K are sectional views showing the manufacturing method of the ferroelectric memory according to the embodiment of the present invention, in the order of steps.

Figure 12A:
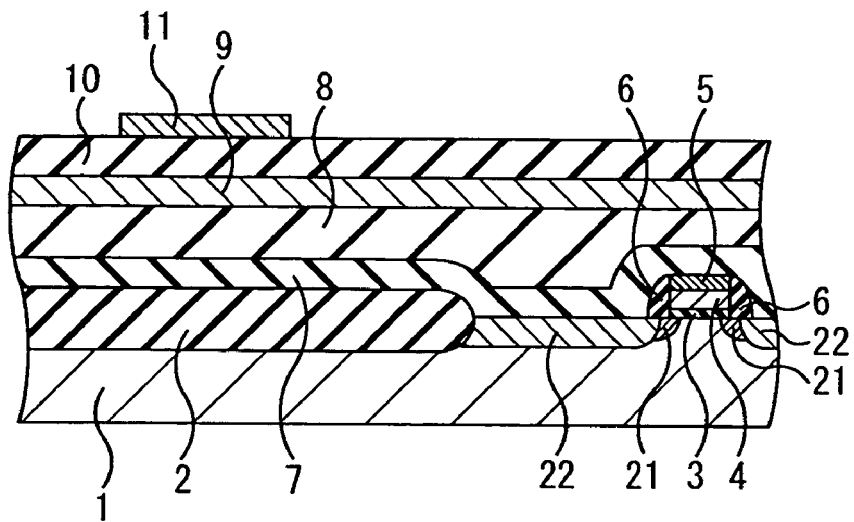
FIGS. 12A to 12K are sectional views showing a manufacturing method of a ferroelectric memory according to the embodiment of the present invention in the order of steps.

In the present embodiment, first, as shown in FIG. 12A, an element isolation insulating film 2 partitioning an element activating region is formed on a surface of a semiconductor substrate 1 such as a Si substrate by means of, for example, a LOCOS (Local Oxidation of Silicon) method. Next, a transistor (MOSFET) including a gate insulating film 3, a gate electrode 4, a silicide layer 5, a sidewall 6, and source/drain diffusion layers each including a low density diffusion layer 21 and a high density diffusion layer 22 is formed in the element activating region partitioned by the element isolation insulating film 2. Subsequently, on the entire surface, a silicon oxide nitride film 7 is formed so as to cover the MOSFET, further, on the entire surface, a silicon oxidized film 8 is formed. The silicon oxide nitride film 7 is formed in order to prevent hydrogen degradation of the gate insulating film 3 and the like, when the silicon oxidized film 8 is formed.

After that, a bottom electrode film 9 and a ferroelectric film 10 are formed on the silicon oxidized film 8, sequentially. The bottom electrode film 9 is composed of, for example, a Ti film and a Pt film formed thereon. Moreover, the ferroelectric film 10 is formed by a method similar to that of sample No. 2, No. 3, No. 4, or No. 6 show in FIGS. 6 and 7. Subsequently, crystallization annealing of the ferroelectric film 10 is performed. Next, a top electrode film is formed on the ferroelectric film 10, and subjected to patterning, thereby forming a top electrode 11. The top electrode is made of, for example, an $IrO_x$ film. Next, an oxygen annealing for recovering the damages due to patterning using etching is performed.

Figure 12B:
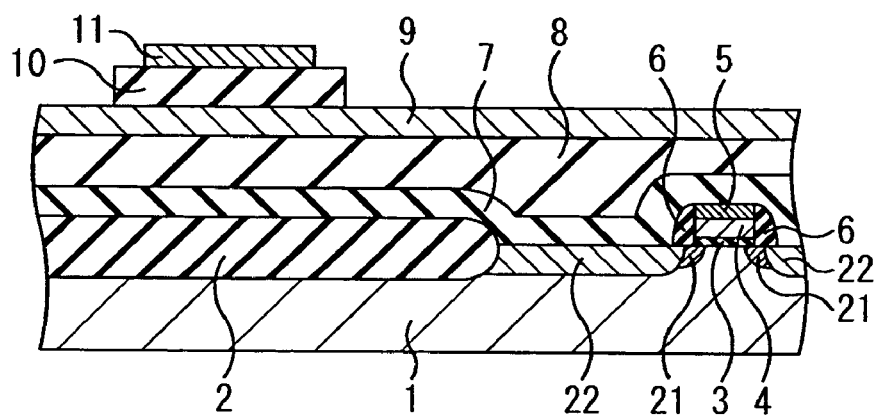

After that, as shown in FIG. 12B, by performing patterning of the ferroelectric film 10, a capacitor insulating film is formed. Subsequently, an oxygen annealing for preventing peeling is performed.

Figure 12C:
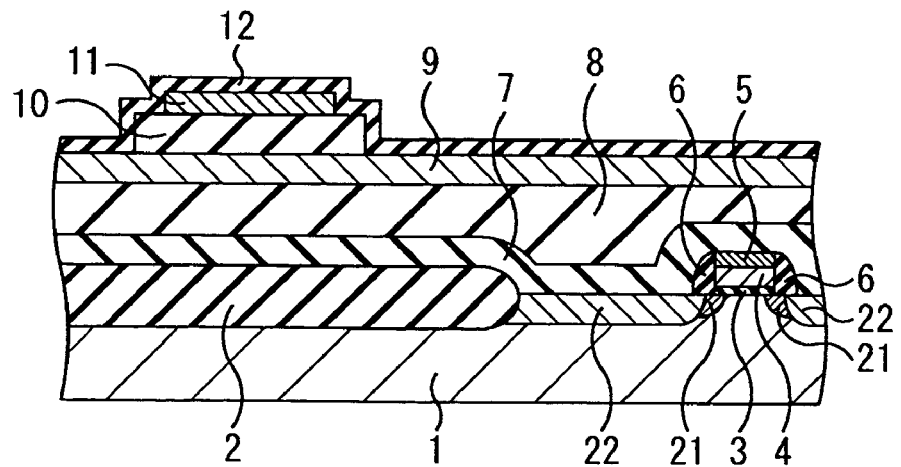

Next, as shown in FIG. 12C, as a protective film, an $Al_2O_3$ film 12 is formed on the entire surface by a sputtering method. Next, in order to relax the damages due to the sputtering, an oxygen annealing is performed. Penetration of hydrogen from outside in the ferroelectric capacitor is prevented by the protective film ($Al_2O_3$ film 12) at this time.

Figure 12D:
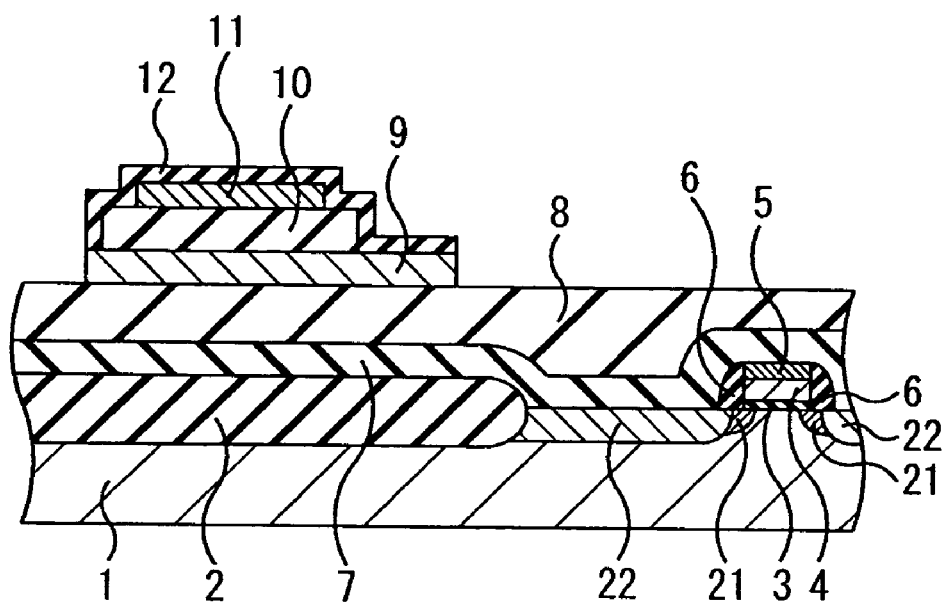

After that, as shown in FIG. 12D, by performing patterning of the $Al_2O_3$ film 12 and the bottom electrode film 9, a bottom electrode is formed. Subsequently, an oxygen annealing for preventing peeling is performed.

Figure 12E:
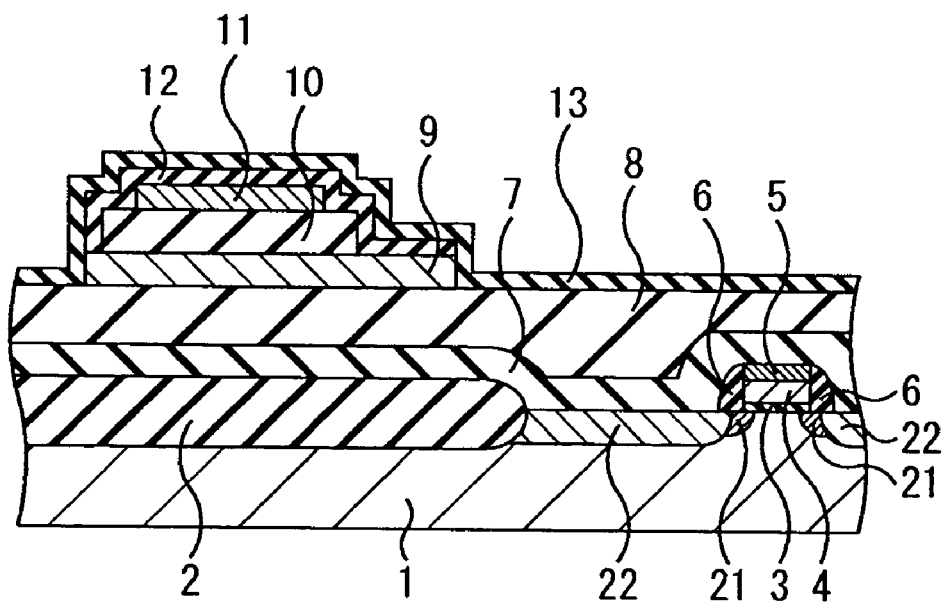

Next, as shown in FIG. 12E, as a protective film, an $Al_2O_3$ film 13 is formed on the entire surface by a sputtering method. Subsequently, in order to reduce capacitor leak, an oxygen annealing is performed.

Figure 12F:
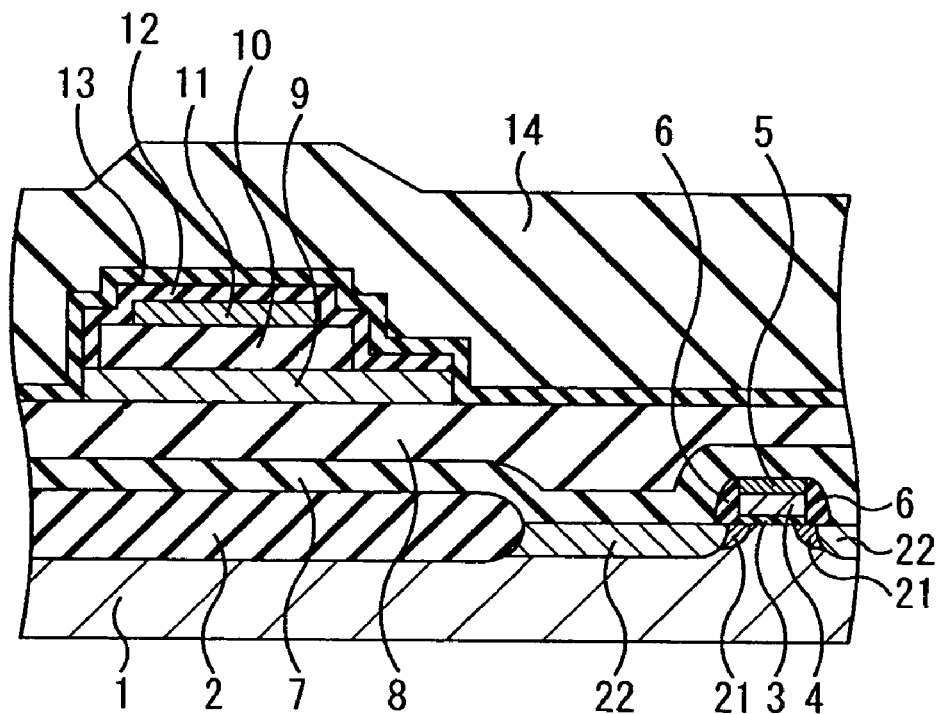

After that, as shown in FIG. 12F, for example, by a high density plasma method, an interlayer insulating film 14 is formed on the entire surface. The thickness of the interlayer insulating film 14 is set to, for example, about 1.5 μm.

Figure 12G:
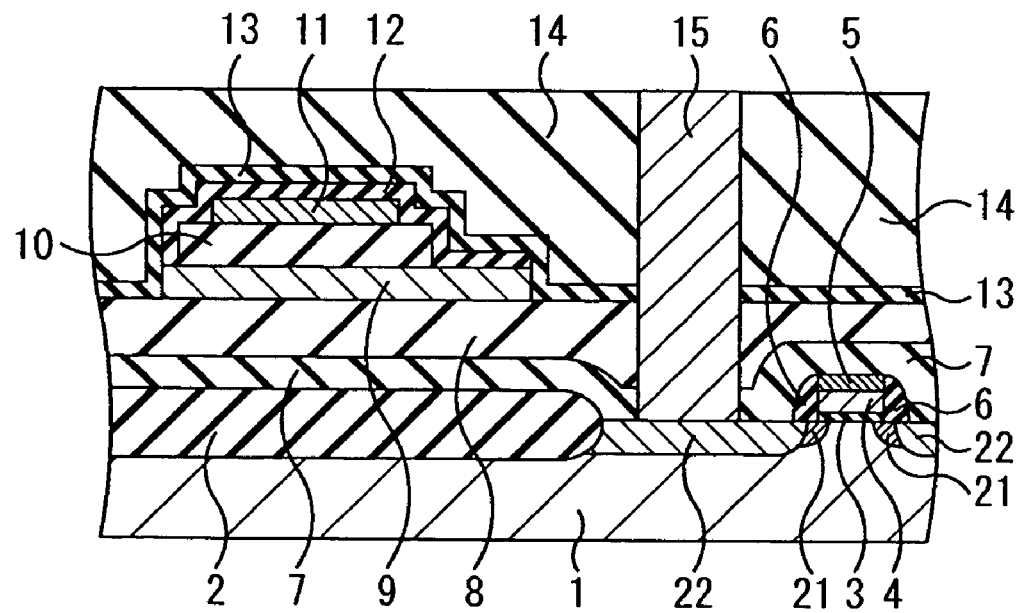

Subsequently, as shown in FIG. 12G, by a CMP (chemical mechanical polishing) method, planarization of the interlayer insulating film 14 is performed. Next, a plasma treatment using $N_2O$ gas is performed. As a result, the surface layer portion of the interlayer insulating film 14 is slightly nitrided, thereby, moisture hardly penetrates thereinto. It should be noted that the plasma treatment is effective when a gas containing at least one of N or O is used. Next, holes reaching the high density diffusion layer 22 of a transistor are formed throughout the interlayer insulating film 14, the $Al_2O_3$ film 13, the silicon oxidized film 8, and the silicon oxide nitride film 7. After that, by sequentially forming a Ti film and a TiN film in the hole by a sputtering method, a barrier metal film (not shown) is formed. Subsequently, by further burying a W (tungsten) film in the hole by a CVD (chemical vapor deposition) method, and by performing planarization of the W film, a W plug 15 is formed.

Figure 12H:
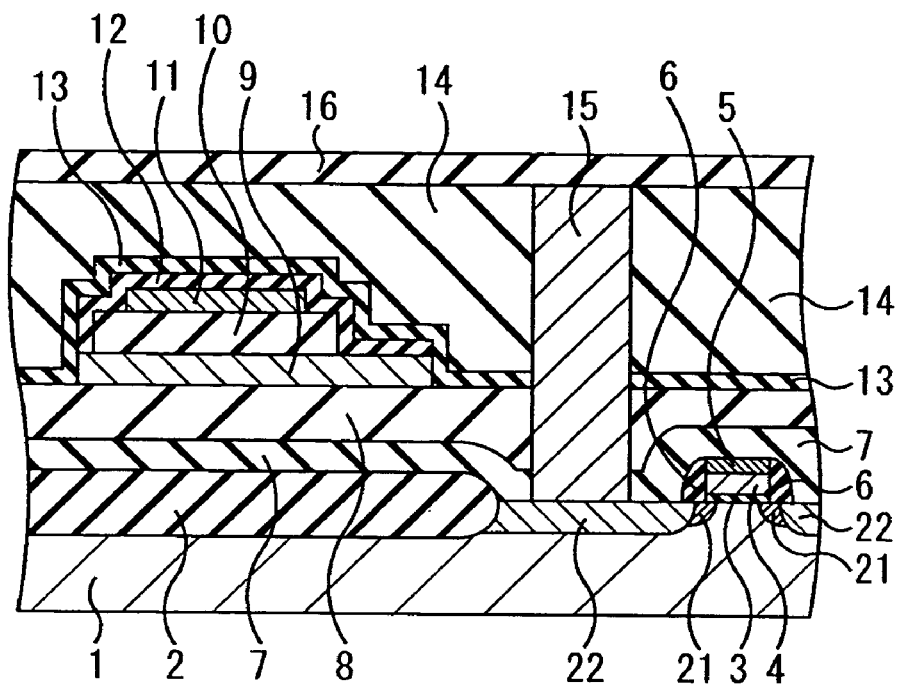

Next, as shown in FIG. 12H, as an oxidation protective film of the W plug 15, an SiON film 16 is formed by an enhanced plasma CVD method, for example.

Figure 12I:
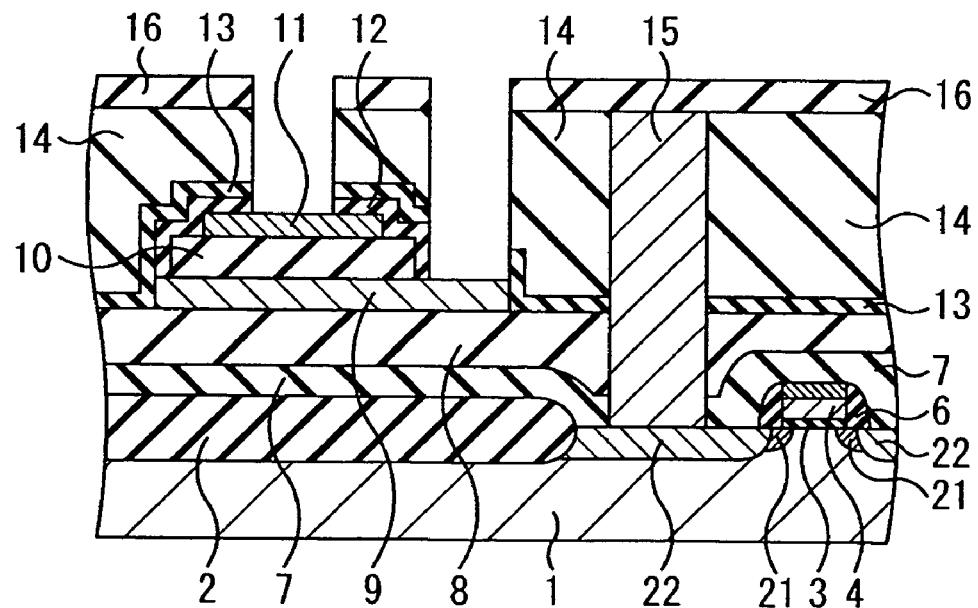

Next, as shown in FIG. 12I, holes reaching the top electrodes 11, and holes reaching the bottom electrodes (the bottom electrode film 9) are formed throughout the SiON film 16, the interlayer insulating film 14, $Al_2O_3$ film 13, and the $Al_2O_3$ film 12. After that, in order to recover damages, an oxygen annealing is performed.

Figure 12J:
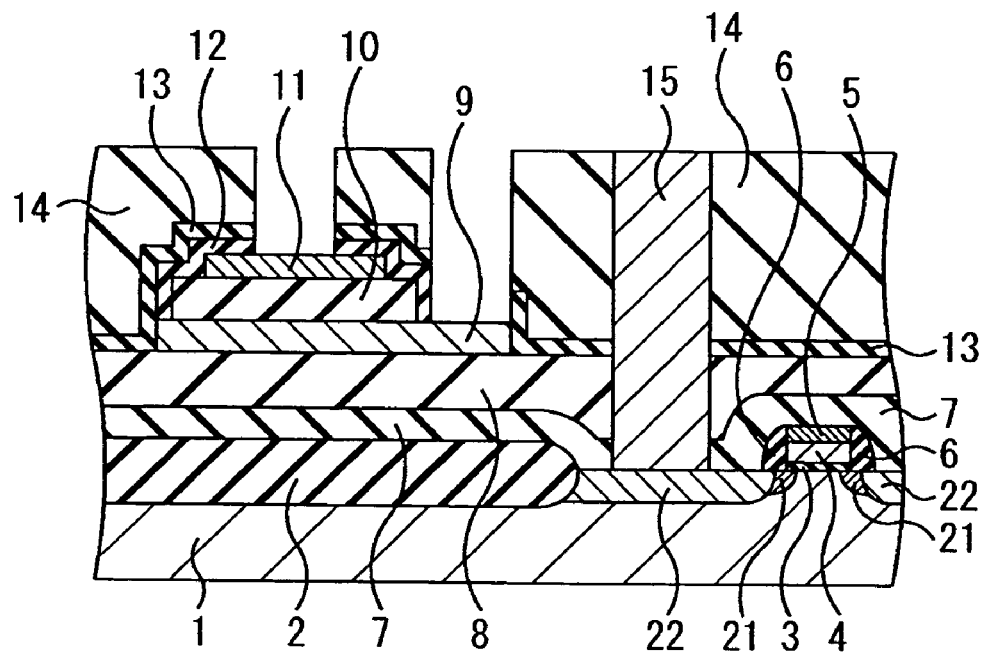
Figure 12K:
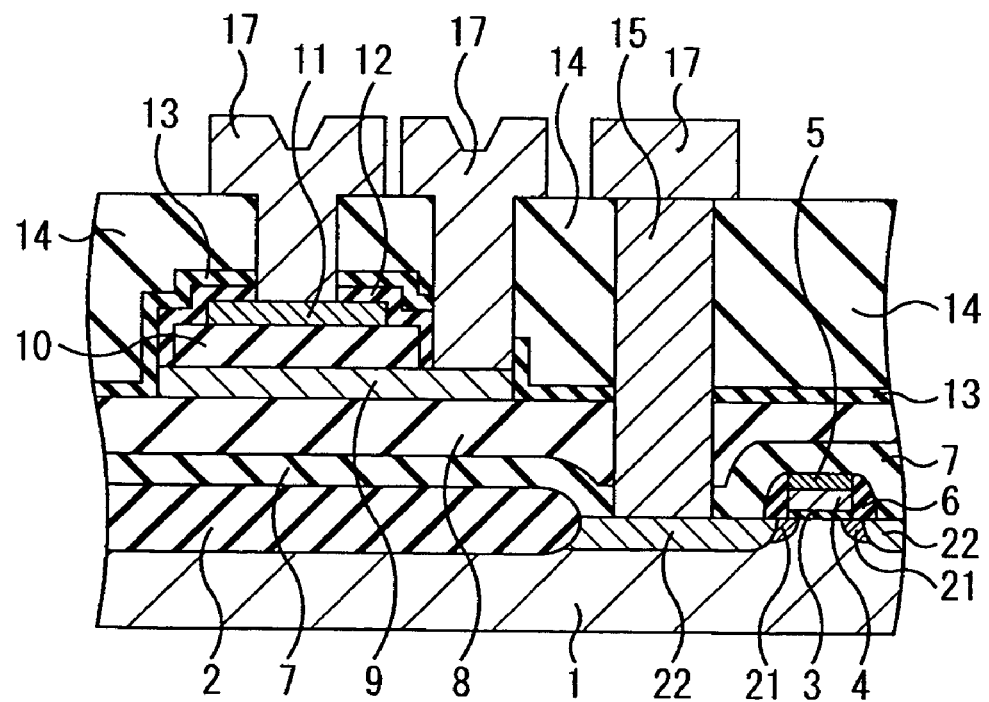

Subsequently, as shown in FIG. 12J, by removing the SiON film 16 throughout the entire surface by etching back, the surface of W plug 15 is exposed. Next, as shown in FIG. 12K, an Al film is formed, with a part of the surface of the top electrode 11, a part of the surface of the bottom electrode (the bottom electrode film 9), and the surface of the W plug 15 being exposed, and then by performing patterning of the Al film, Al wirings 17 are formed. At that time, for example, using the Al wirings 17, the W plug 15 and the top electrode 11 or the bottom electrode are connected to each other.

After that, an interlayer insulating film, a contact plug, and wirings of the second and subsequent layers from the bottom are further formed. Then, a cover film composed of a TEOS oxidized film and an SiN film, for example, is formed to complete a ferroelectric memory with a ferroelectric capacitor.

Since, in this way, in the present embodiment, the ferroelectric film 10 is formed by a method similar to that of sample No. 2, No. 3, No. 4, or No. 6 shown in FIGS. 6 and 7, its termination layer is an excess Zr layer. Accordingly, the fluctuation of the leak current is suppressed. Therefore, even if the A/B ratio of the PZT film is not preliminarily set to be low, it is possible to suppress the excess of the leak current beyond its tolerance. In other words, by setting the A/B ratio to be high, it is possible to ensure a large switching charge amount Qsw easily.

Note that, in the above-mentioned embodiment, a planar-type ferroelectric capacitor was manufactured; however, the present invention may also be applied to a stack-type ferroelectric capacitor. In this case, a part of a contact plug such as a W plug connected to a transistor such as MOSFET is connected to, for example, the bottom electrode of the ferroelectric capacitor.

Moreover, the material of the ferroelectric film is not limited to PZT, rather, for example, a material that is PZT doped with Ca, Sr, La, Nb, Ta, Ir, and/or W, can also be used. Further, other than the PZT-based film, even when an SBT-based film or a Bi layer-based film is formed, the effect of the present invention is attained. However, the crystal structure of the ferroelectric film is required to be an $ABO_3$-type, and it is required to provide a non-MPB (morphotropic phase boundary) layer (for example, an excess Zr layer) containing such an atom that most hardly changes its valence number among a plurality of atoms arranged at B-sites, more excessively than the MPB compositions with respect to the plural kinds of atoms. This is because, atoms that easily change their valence numbers can be present stably even if oxygen bonded to them is lacked, thereby, as atoms that easily change their valence numbers increase, electrons tend to be liberated and leak current tents to be larger in a ferroelectric film. In other words, by providing a non-MPB layer containing such an atom that most hardly changes its valence number more excessively, such increase of the leak current can be suppressed. For example, in case of PZT, when compared with Zr and Ti, the valence number of Zr hardly changes from 4, but the valence number of Ti easily changes from 4 to 2. Consequently, in the above-mentioned embodiment, an excess Zr layer is provided.

Moreover, when the orientation of the ferroelectric film is considered, it is preferable for a non-MPB layer to be formed as the termination layer, however, it is not limited to this, rather, it may be formed as the initial layer, for example. Regardless the location of the non-MPB layer, its thickness is preferable to be 20 nm or less. This is because when the thickness of the non-MPB layer is above 20 nm, there is a possibility that the switching charge amount Qsw of the ferroelectric capacitor may be insufficient. Moreover, as known from the above-mentioned experimental results, it is also preferable for the thickness of the non-MPB layer to be 2 nm or more.

Moreover, it is preferable for the A/B ratio in the non-MPB layer to be smaller than those in the other parts of the ferroelectric film. This is because the contribution of other parts of the ferroelectric film on the switching charge amount Qsw is larger than that of the non-MPB layer.

Moreover, the structure of the ferroelectric memory cell is not limited to 1T1C type, rather, it may also be 2T2C type.

INDUSTRIAL APPLICABILITY

As mentioned above in detail, according to the present invention, by the presence of the non-MPB (morphotropic phase boundary) layer, even if the A/B ratio of the ferroelectric film fluctuates, it is possible to suppress the fluctuation of the leak current. Consequently, even if the A/B ratio of the ferroelectric film is not set to be low preliminarily, it is possible to suppress the excess of the leak current beyond its tolerance. In other words, by setting the A/B ratio to be high, it is possible to ensure a large switching charge amount Qsw easily.

What is claimed is:

1. A semiconductor device comprising:
   a semiconductor substrate;
   a pair of electrodes formed above said semiconductor substrate; and
   a ferroelectric film composed of an $ABO_3$-type structure and sandwiched between said pair of electrodes, said ferroelectric film having, in a part thereof, a non-morphotropic phase boundary layer containing an atom which most hardly changes its valence number among plural kinds of atoms arranged at the B site more excessively than the morphotropic phase boundary compositions with respect to said plural kinds of atoms,
   wherein a ratio of the total number of atoms arranged at the A site with respect to the total number of atoms arranged at the B site in said non-morphotropic phase boundary layer is smaller than that of the total number of atoms arranged at the A site with respect to the total number of atoms arranged at the B site in the other parts of said ferroelectric film.

2. The semiconductor device according to claim 1, wherein said ferroelectric film is formed on one electrode located at lower side of said pair of electrodes, and
   said non-morphotropic phase boundary layer is located at the top of said ferroelectric film.

3. The semiconductor device according to claim 1, wherein a thickness of said non-morphotropic phase boundary layer is from 2 nm to 20 nm, inclusive.

4. The semiconductor device according to claim 1, wherein an atom arranged at the A site of said ferroelectric film includes Pb, and an atom arranged at the B site includes Zr and Ti, and
   said non-morphotropic phase boundary layer contains Zr more excessively than the morphotropic phase boundary composition with respect to Zr and Ti.

5. The semiconductor device according to claim 1, wherein an atom arranged at the A site of said ferroelectric film includes Pb, and an atom arranged at the B site includes Zr and Ti, and
   an initial ferroelectric layer is formed on one electrode located at lower side of said pair of electrodes, said initial ferroelectric layer containing Ti more excessively than the morphotropic phase boundary composition with respect to Zr and Ti.

6. The semiconductor device according to claim 1, wherein, in a part of said ferroelectric film except for said non-morphotropic phase boundary film, an atom which most hardly changes its valence number among plural kinds of atoms arranged at the B site is contained less than the morphotropic phase boundary composition with respect to said plural kinds of atoms.

* * * * *